(12) United States Patent
Fukuda et al.

(10) Patent No.: US 7,964,037 B2
(45) Date of Patent: Jun. 21, 2011

(54) DEPOSITION APPARATUS

(75) Inventors: Naoto Fukuda, Funabashi (JP);
Toshiaki Yoshikawa, Yokohama (JP);
Seiji Mashimo, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 1037 days.

(21) Appl. No.: 11/764,403

(22) Filed: Jun. 18, 2007

(65) Prior Publication Data
US 2008/0014825 A1   Jan. 17, 2008

(30) Foreign Application Priority Data

Jul. 13, 2006   (JP) .................... 2006-192294

(51) Int. Cl.
*C23C 16/00* (2006.01)
(52) U.S. Cl. ........................................ 118/726
(58) Field of Classification Search ............ 118/726
See application file for complete search history.

(56) References Cited

U.S. PATENT DOCUMENTS

| | | | | |
|---|---|---|---|---|
| 4,351,855 A * | 9/1982 | Pinkhasov | ............... | 427/564 |
| 5,168,543 A * | 12/1992 | Murray | ............... | 392/388 |
| 5,449,444 A | 9/1995 | Yoshikawa | ............... | 204/192.12 |
| 5,720,808 A | 2/1998 | Hirabayashi et al. | ......... | 117/103 |
| 6,015,594 A | 1/2000 | Yoshikawa | ............... | 427/398.1 |
| 2001/0011524 A1 * | 8/2001 | Witzman et al. | ............... | 118/718 |
| 2002/0000197 A1 * | 1/2002 | Masuda et al. | ............... | 118/715 |
| 2005/0005857 A1 * | 1/2005 | Kido et al. | ............... | 118/726 |
| 2006/0124061 A1 * | 6/2006 | Saito et al. | ............... | 118/726 |
| 2007/0298159 A1 * | 12/2007 | Bender et al. | ............... | 427/8 |

FOREIGN PATENT DOCUMENTS

| | | |
|---|---|---|
| JP | 2004-241319 | 8/2004 |
| JP | 2006-063446 | 3/2006 |
| JP | 2006-114427 | 4/2006 |

* cited by examiner

*Primary Examiner* — Keath T Chen
(74) *Attorney, Agent, or Firm* — Fitzpatrick, Cella, Harper & Scinto

(57) ABSTRACT

A vacuum deposition apparatus capable of enhancing the productivity of an organic electroluminescence device is realized. A first pipe is connected to a deposition source for evaporating an organic electroluminescence material, and two second pipes are directed to two film deposition objects comprised of substrates and masks, whereby an organic deposition film is formed. Vapor is released simultaneously from the deposition source to plural film deposition objects on different planes to deposit films, which promotes the reduction in film deposition time and the miniaturization of an apparatus.

5 Claims, 5 Drawing Sheets

DEPOSITION APPARATUS

BACKGROUND OF THE INVENTION

1. Field of the Invention

The present invention relates to a deposition apparatus for producing an organic electroluminescence device.

2. Description of the Related Art

In an organic electroluminescence device, generally, a hole transport layer, a luminescent layer, an electron transport layer, and the like are formed as organic thin film layers between a positive electrode made of a transparent conductive film (e.g., an indium tin oxide) and a negative electrode made of a metal (e.g., Al). Holes injected from the positive electrode side and electrons injected from the negative electrode side are recombined in the luminescent layer via the hole transport layer and an electron injection layer respectively, whereby light emission is obtained.

As a method of producing an organic electroluminescence device, a vacuum deposition method is known. An organic electroluminescence material is placed in a crucible, and the temperature of the crucible and the like is raised to a vaporization temperature or higher of a deposition material in a vacuum apparatus. As a result, the deposition material vaporized from the crucible is deposited on a substrate to be a base of the organic electroluminescence device to form organic thin film layers. In order to enhance the productivity of the organic electroluminescence device, the deposition rate of a deposition material is important. If the deposition rate of the deposition material is high, the film deposition time is shortened to enhance productivity. In order to enhance the deposition rate, there may be employed a method involving bringing an opening for a deposition source close to a substrate, a method involving raising the heating temperature of a deposition material to increase the deposition rate, or the like.

However, when the opening for the deposition source is brought close to the substrate, there arise problems such as thermal influence on a mask etc. caused by radiated heat from the deposition source, and non-uniformity of the film thickness. The thermal influence on the mask causes a problem in the case of using a high-precision mask, particularly, for divisional coating of the luminescent layer. The non-uniformity of the film thickness has a large influence on the characteristics of the organic electroluminescence device, so an organic deposition film should be formed with a uniform film thickness over the film deposition face of the substrate.

Further, when the heating temperature of the deposition material is raised, there arises a problem of decomposition of the organic electroluminescence material in some cases. The decomposition of the organic electroluminescence material has a large influence on the characteristics of the organic electroluminescence device, which directly leads to the decrease in yield. As described above, in order to enhance the productivity of the organic electroluminescence device, problems such as the decomposition of the organic electroluminescence material and the thermal influence should be solved. It may be possible to increase the number of vacuum deposition apparatuses to increase the number of substrates to be processed, thereby enhancing the productivity. However, this requires a large apparatus setting area, which is not desirable in terms of investment cost.

Concerning such vacuum deposition method of the organic electroluminescence material, a method of forming a film by distributing substrates into two deposition chambers is known, for example, in Japanese Patent Application Laid-Open No. 2004-241319. According to this method, although the productivity is enhanced, the apparatus setting area increases. Thus, there is a demand for reducing the apparatus setting area and enhancing productivity.

SUMMARY OF THE INVENTION

The present invention has been made in view of the unsolved problems of the above-mentioned conventional technique, and provides a deposition apparatus capable of increasing the number of substrates to be processed for organic deposition film deposition, preventing an increase in the apparatus setting area, and ensuring a film thickness distribution.

A deposition apparatus according to the present invention includes: a chamber; a holding unit placed in the chamber for holding a plurality of film deposition objects in mutually different planes; a deposition source for storing a deposition material to be deposited on the plurality of film deposition objects; and a flow unit connected to the deposition source for guiding the deposition material evaporated to the plurality of film deposition objects held in the mutually different planes.

By simultaneously forming an organic deposition film via a flow unit with respect to a plurality of film deposition objects facing in different directions in a chamber, the number of substrates to be processed is increased to enhance the productivity of the organic electroluminescence device.

Further features of the present invention will become apparent from the following description of exemplary embodiments with reference to the attached drawings.

DESCRIPTION OF THE EMBODIMENTS

The best mode for carrying out the present invention will be described with reference to the drawings.

Figure 1:
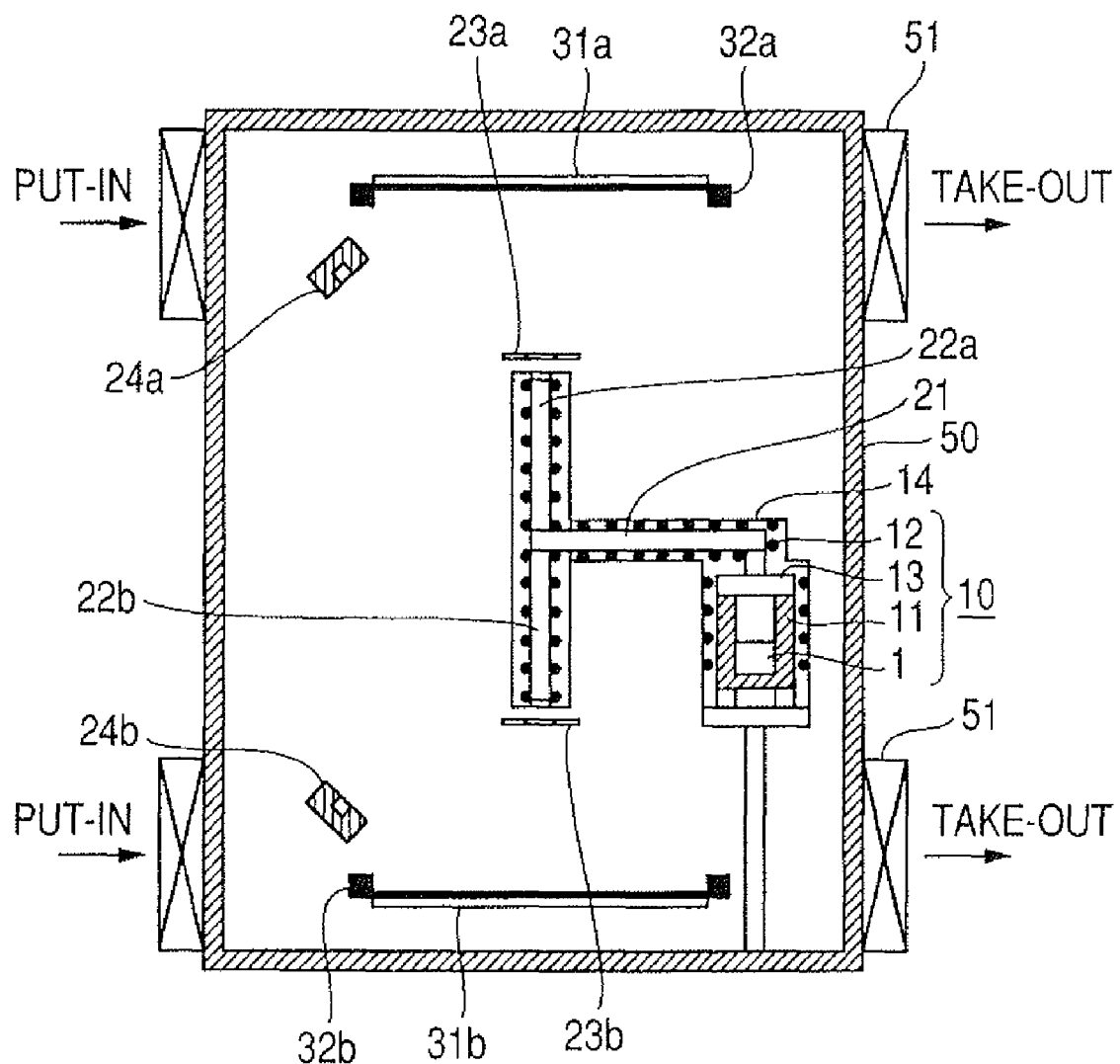
FIG. 1 is a schematic view illustrating a deposition apparatus according to Example 1.

As illustrated in FIG. 1, a deposition source 10 includes a crucible 11, a heater 12 for heating the crucible 11 and the like, a cover 13, and a reflector 14. An organic electroluminescence material 1 is filled into the crucible 11, and vapor is released from second pipes (branching pipes) 22a, 22b branching from a first pipe 21 via the first pipe (connecting pipe) 21 connected to the cover 13.

The vapor generated from the deposition source 10 is released branching in directions different from each other by a flow unit including the first pipe 21 and the second pipes 22a, 22b, and forms an organic deposition film on substrates 31a, 31b via masks 32a, 32b, respectively.

Figure 2:
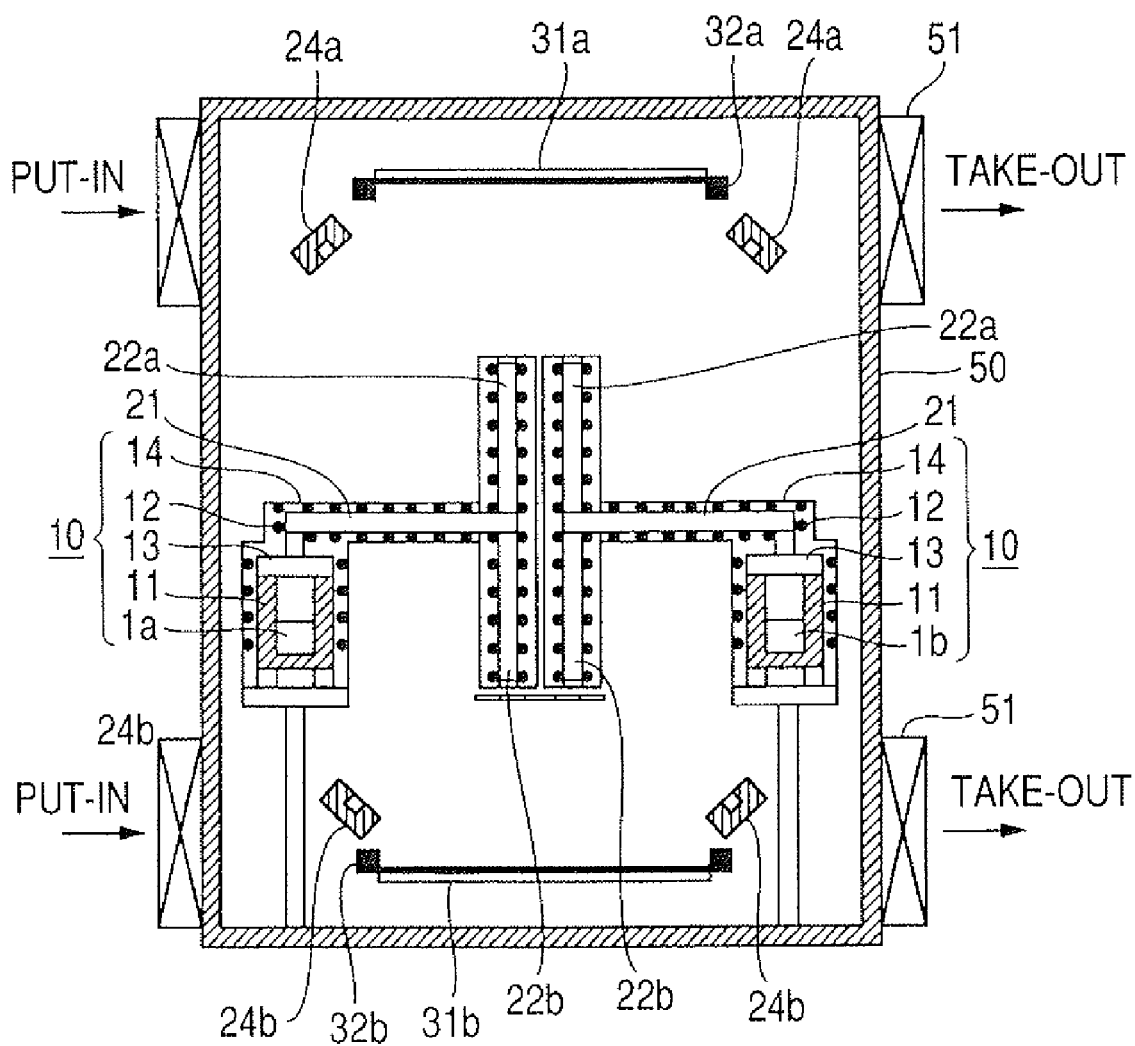
FIG. 2 is a schematic view illustrating a deposition apparatus according to Example 2.

It is desirable that film deposition objects comprised of the masks 32a, 32b and the substrates 31a, 31b be placed so as to be opposed to each other in a chamber 50. If the thermal influence from the deposition source 10 with respect to the film deposition objects is small, the organic deposition film may be formed using one deposition source 10 with respect to one film deposition object, or plural deposition sources 10 may be used as illustrated in FIG. 2.

Figure 3:
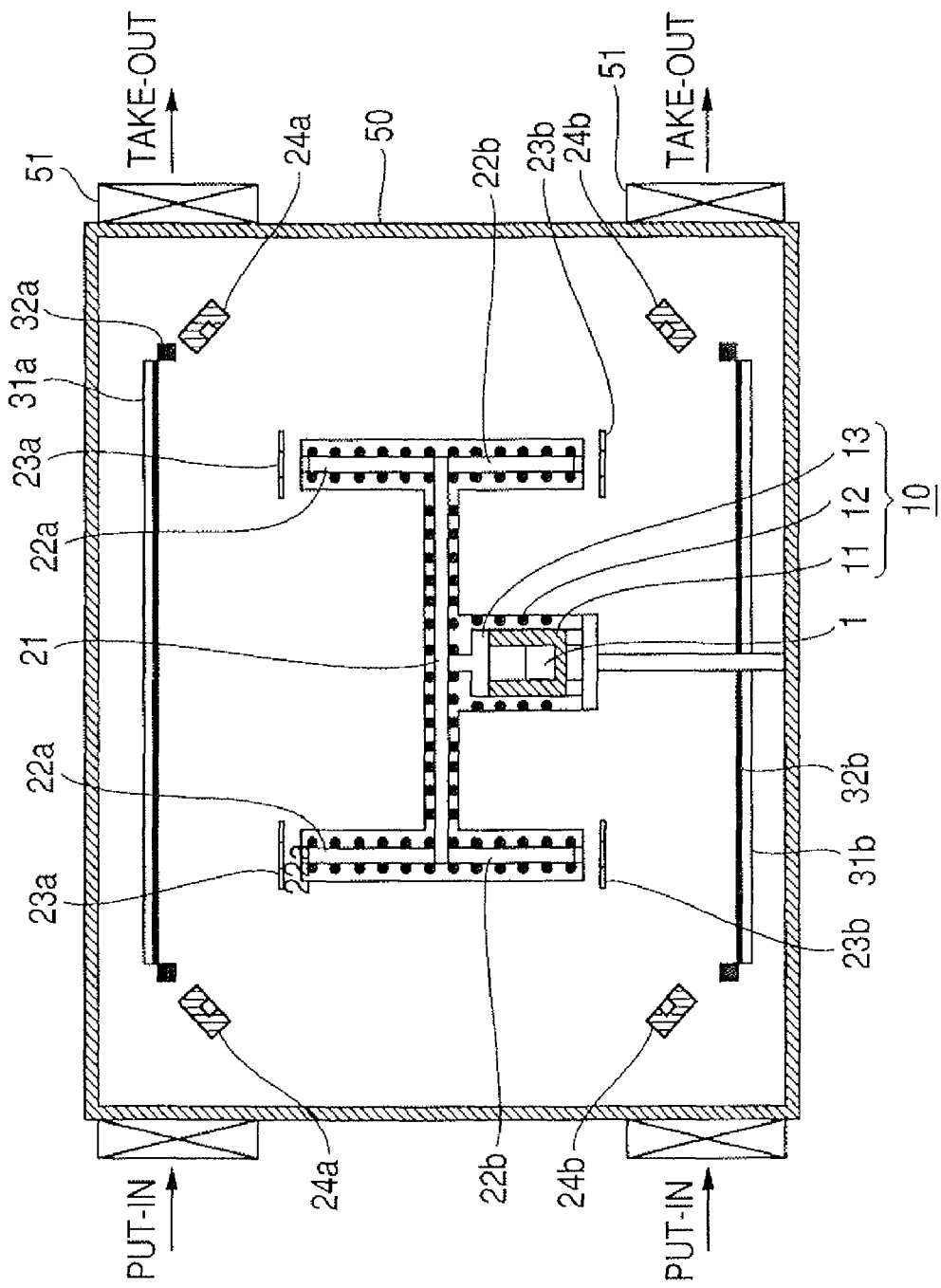
FIG. 3 is a schematic view illustrating one modified example of Example 1.
Figure 4:
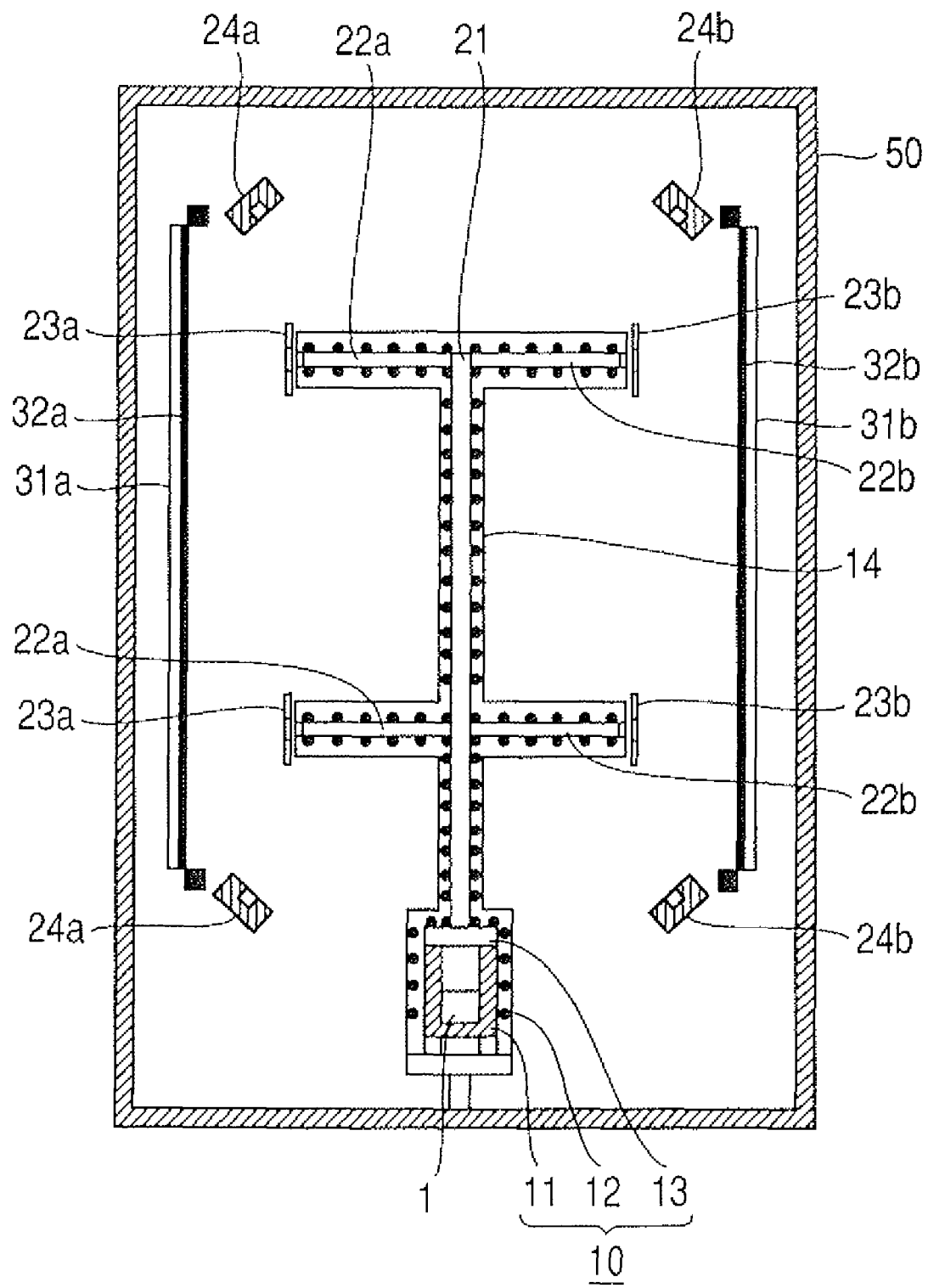
FIG. 4 is a schematic view illustrating another modified example of Example 1.

Alternatively, as illustrated in FIGS. 3 and 4, the second pipes 22a, 22b may be connected to both ends of the first pipe 21 connected to the cover 13 of the deposition source 10, or may be connected to plural portions in a longitudinal direction of the first pipe 21.

It is desirable that shutters 23a, 23b be provided individually between the openings of the respective second pipes 22a, 22b and the substrates 31a, 31b. Further, it is desirable that film thickness sensors 24a, 24b be also provided individually. When the shutters 23a, 23b and the film thickness sensors 24a, 24b are placed individually, even if the evaporation rates of the organic electroluminescence material evaporated from the openings of the respective second pipes 22a, 22b are different from each other, the film thickness can be controlled on the substrates 31a, 31b by opening/closing the shutters 23a, 23b, individually.

The chamber 50 may be provided with an alignment mechanism (not shown) and high-precision masks may be used as the masks 32a, 32b so that divisional coating film deposition of a luminescent layer is performed. As a vacuum exhaust system (not shown) for exhausting the chamber 50, a vacuum pump capable of performing rapid exhaustion to obtain a high vacuum region is used desirably.

In the case of using the vacuum deposition apparatus as an apparatus of producing an organic electroluminescence device, the vacuum deposition apparatus may be connected to other vacuum apparatuses via a gate valve 51, and various steps of producing the organic electroluminescence device in those other vacuum apparatuses may be performed. It is desirable that the above-mentioned apparatus of producing an organic electroluminescence device be provided with plural chambers 50, and that a method of placing the deposition source 10, the second pipes 22a, 22b, and the like in the plural chambers 50 be selected depending upon an organic deposition film to be formed.

Plural film deposition objects comprised of substrates and masks are placed in a chamber by a holding unit (not shown), and the second pipes provided with opening ends directed to the plural film deposition objects are placed in an arbitrary direction and at an arbitrary angle.

The film deposition objects comprised of the substrates and masks may be placed in any arrangement. It is desirable that all the second pipes have the same length from the point of joint members (connecting portions) with respect to the first pipe for the purpose of obtaining uniform heating and uniform inner pressure of the second pipes.

The second pipes and the first pipe may be round pipes, square pipes, straight pipes, or L-type pipes, and are not limited thereto.

It is desirable that heaters provided in the second pipe and the first pipe be provided so as to uniformly heat the entirety of the second pipe and the first pipe.

In a case where a substrate is large, it is desirable to use only a required number of second pipes and first pipes to form a uniform organic deposition film with less film thickness non-uniformity with respect to a film deposition face of the substrate.

Further, in the case of using structures comprised of a deposition source, second pipes and a fist pipe in a co-deposition process of organic electroluminescence materials, a plurality of the above-mentioned structures may be placed in a chamber as illustrated in FIG. 2. A method of placing the above-mentioned structures is not limited to that in FIG. 2.

Further, the deposition source may be placed outside the chamber. In the case where the deposition source is placed outside the chamber, a deposition material can be set or exchanged while the chamber is kept in vacuum. Further, the first pipe or the second pipe may be provided with a valve at some midpoint thereof. In the case where the valve is provided, the flow rate of the deposition material and the pressure in the pipe can also be regulated.

Further, the areas and the shapes of the openings of the second pipes may be different from one another, and the opening shape may be any shape such as a circle, a rectangle, or an oval. The opening area and shape can be varied, whereby the film thickness controllability on a substrate is further improved. For the same reason, the inner diameter, thickness, shape, and the like of each second pipe may be varied individually.

In a case where divisional coating film deposition of a luminescent layer is conducted using a high-precision mask, film deposition can be conducted while moving a substrate that is a film deposition object and a mask placed on the substrate with a moving unit, considering the thermal influence on the mask. Further, the film deposition may be conducted while moving the structure comprised of the deposition source, the second pipes, and the first pipe with a moving unit. The process of conducting film deposition while moving the structures may be used for a co-deposition process.

Example 1

FIG. 1 illustrates a vacuum deposition apparatus according to Example 1. Into a crucible 11, 1.0 g of an organic electroluminescence material 1 was filled, and a cover 13 was attached to the crucible 11, whereby a deposition source 10 was set. In the present example, a first pipe 21 having second pipes 22a, 22b is provided to the cover 13 of the deposition source 10. Each of the second pipes 22a, 22b is a round pipe having an overall length of 100 mm, an outer diameter of 20 mm, and an inner diameter of 10 mm. The first pipe 21 is a square pipe having an overall length of 100 mm, a side length of 20 mm×20 mm, and a thickness of 5 mm. Connecting portions for connecting the first pipe 21 to the second pipes 22a, 22b and to the cover 13 are provided in the vicinity of both end portions of the first pipe 21. The second pipes 22a, 22b and the cover 13 are connected to the first pipe 21 through the connecting portions, whereby a flow path of an organic electroluminescence material evaporated from the crucible 11 is provided. The first pipe 21 is not provided with an opening except for the connecting portions. Further, the connecting portion between the second pipes 22a, 22b and the first pipe 21, and the connecting portion between the first pipe 21 and the cover 13 were formed in a flange shape, thereby preventing the leakage of the evaporated organic electroluminescence material.

The center of a film deposition face of each of substrates 31a, 31b is placed on a center axis of the opening of each of the second pipes 22a, 22b, and the straight distance from each opening end to the film deposition faces of the opposite substrates 31a, 31b was set to 300 mm. In the present example, the terminating ends of the second pipes 22a, 22b are openings. However, a plate member provided with an opening having a diameter smaller than the inner diameter of the second pipes 22a, 22b may be provided at each terminating end of the second pipes 22a, 22b to be used as a cover.

Next, 20 substrates of 50 mm×50 mm, having a thickness of 0.7 mm, were set in a substrate stock device (not shown) connected to a chamber 50 via a gate valve 51, and the substrate stock device was exhausted to $1.0 \times 10^{-5}$ Pa or less via a vacuum exhaust system (not shown). The chamber 50 was also exhausted to $1.0 \times 10^{-5}$ Pa via a vacuum exhaust system (not shown). After the exhaustion, the crucible 11 was heated to 200° C. with a heater 12. The power of the heater was controlled based on the temperature in the vicinity of a bottom surface of the crucible 11. An organic electroluminescence material 1 was degassed while the temperature in the vicinity of the bottom surface of the crucible 11 was kept at 200° C. for 30 minutes, and thereafter, the crucible 11 was heated to a temperature at which the deposition rate reached 1.0 nm/sec with respect to each of film thickness sensors 24a, 24b.

When the deposition rates reached 1.0 nm/sec in each of the film thickness sensors 24a, 24b, two substrates were put into the chamber 50 from another chamber (not shown), and film deposition was conducted. The film deposition was conducted so that the film thickness became 100 nm at center portions of the substrates 31a, 31b, and the substrates 31a, 31b were taken out immediately after the film deposition. Then, next substrates were put therein. In this process, the film deposition was conducted successively under the above-mentioned condition with respect to 20 substrates.

Figure 5:
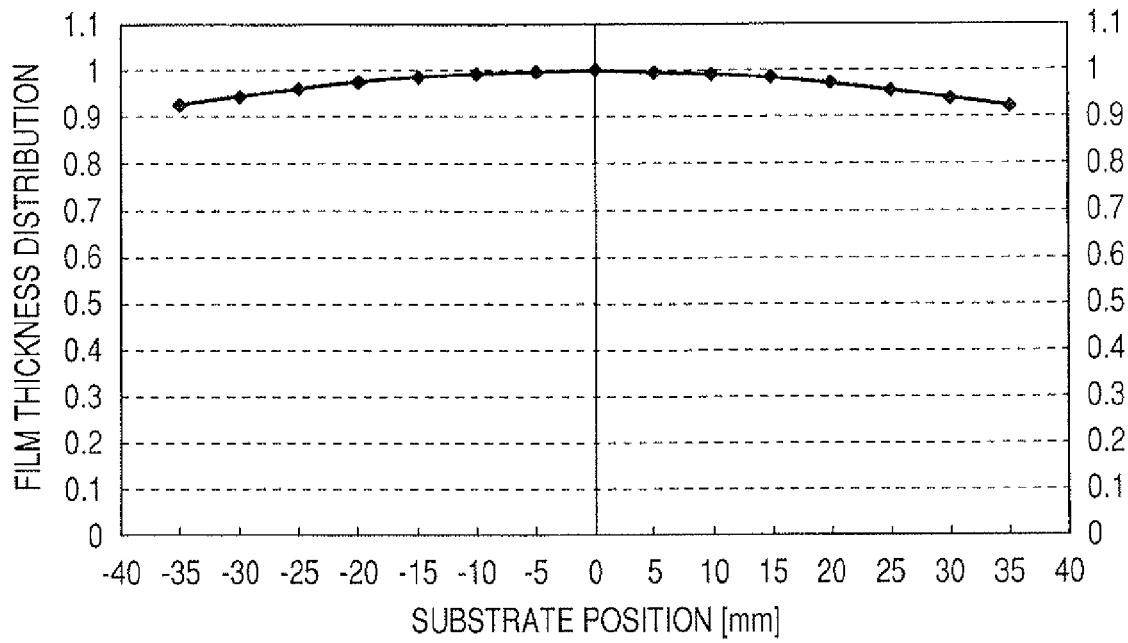
FIG. 5 is a graph illustrating the film thickness distribution of the film deposition face in Example 1.

When the film deposition was conducted by the above-mentioned method, it took about 30 minutes to complete the film deposition with respect to 20 substrates. Further, a film thickness distribution of about ±5.0% was obtained in a plane of all the 20 substrates. FIG. 5 illustrates the results of film thickness distributions measured on diagonal lines of the substrates. It was found that the film deposition was conducted with excellent reproducibility regarding the film thickness distribution, so it is considered that there is no problem in terms of yield.

Figure 6:
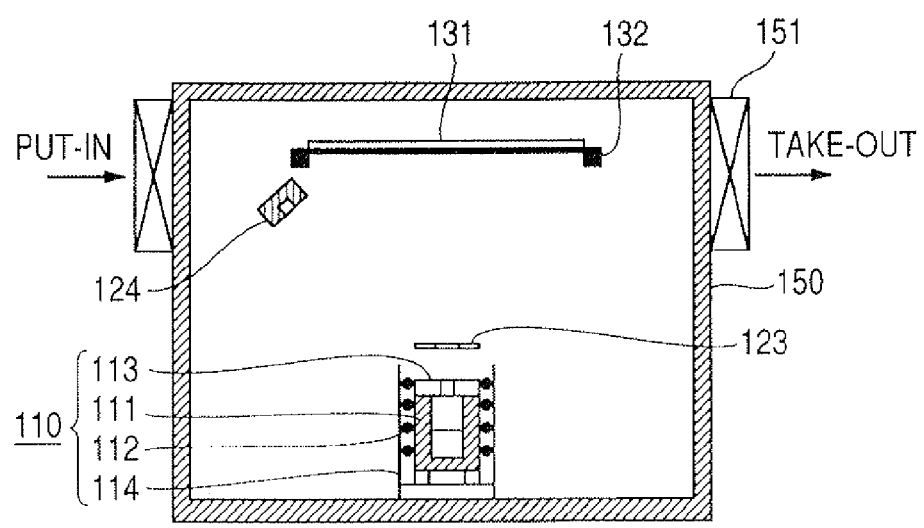
FIG. 6 is a schematic view illustrating a deposition apparatus according to one conventional example.

In order to verify the effects of the present invention regarding the time required for the completion of the film deposition, an experiment was conducted for the comparison with the case where film deposition was conducted in a vacuum deposition apparatus with a conventional configuration illustrated in FIG. 6. More specifically, vapor of an organic electroluminescence material was generated from a deposition source 110 comprised of a crucible 111 and a heater 112 toward a film deposition object comprised of a substrate 131 and a mask 132 in a chamber 150, and deposition was conducted via the opening provided to a cover 113.

Even in the vacuum deposition apparatus with a conventional configuration, a film thickness distribution of about ±5.0% was obtained in a plane of all the 20 substrates. However, it took about 60 minutes until the completion of the film deposition. Thus, it was found that the method of the present example is more advantageous in terms of the enhancement of productivity, and is capable of producing a product of the same quality as that in the case of using a conventional technique in a shorter period of time.

In the case of using a large substrate, in order to obtain a film thickness distribution without non-uniformity in a film deposition face of a substrate, plural second pipes may be provided so as to be opposed to one substrate as illustrated in FIGS. 3 and 4. In this case, it is desirable that a film thickness sensor be provided for each opening of the second pipes. Further, it is desirable that a shutter be provided at the opening of each second pipe. In the case of using a high precision mask, divisional coating film deposition may be conducted using an alignment stage. In this case, if there is a problem of the thermal influence on a high precision mask, a number of reflectors may be used, and if required, a cooling pipe or an air-cooling pipe may be provided.

Example 2

FIG. 2 illustrates Example 2. The film deposition conditions are the same as those in Example 1, except that a film is deposited using two deposition sources. Two crucibles 11 were filled with organic electroluminescence materials 1a, 1b in an amount of 1.0 g, and a cover 13 was attached to each crucible 11, whereby deposition sources 10 were set. In the present example, second pipes 22a, 22b and a first pipe 21 are provided to the respective deposition sources 10.

Each of the second pipes 22a, 22b is a round pipe with an overall length of 100 mm, an outer diameter of 20 mm, and an inner diameter of 10 mm. Each of the first pipes 21 is a square pipe with an overall length of 100 mm, a side length of 20 mm×20 mm, and a thickness of 5 mm. Each of the first pipes 21 is provided with connecting portions for connecting the first pipes 21 to the second pipes 22a, 22b and to the cover 13 at both ends. The second pipes 22a, 22b, the first pipe 21, and the cover 13 are connected with the connecting portions, whereby a flow path of an organic electroluminescence material evaporated from the crucible 11 is provided. Each of the first pipes 21 is not provided with an opening except for the above-mentioned connecting portions. Further, the connecting portions of the second pipes 22a, 22b and the first pipe 21, and the connecting portion of the first pipe 21 and the cover 13 are formed in a flange shape, thereby preventing the leakage of an evaporated organic electroluminescence material.

In the present example, the straight length of the second pipes 22a, 22b to be flow paths of vapor generated from the organic electroluminescence materials 1a, 1b was set to about 35 mm, and the centers of the substrates 31a, 31b were placed so as to be parallel to the planes of the openings on the axis of the middle point of the second pipes 22a, 22b. The straight distance from the opening ends of the respective second pipes 22a, 22b to the film deposition faces of the opposite substrates 31a, 31b was set to 250 mm.

In the present example, the terminating portions of the second pipes 22a, 22b function as openings. However, plate members provided with openings having a diameter smaller than the inner diameter of the second pipes 22a, 22b may be provided at each terminating end of the second pipes 22a, 22b to be used as a cover.

Next, 20 substrates of 50 mm×50 mm, having a thickness of 0.7 mm, were set in a substrate stock device (not shown) connected to a chamber 50 via a gate valve 51, and the substrate stock device was exhausted to $1.0 \times 10^{-5}$ Pa or less via a vacuum exhaust system (not shown). The chamber 50 was also exhausted to $1.0 \times 10^{-5}$ Pa or less via a vacuum exhaust system (not shown). After the exhaustion, the crucible 11 was heated to 200° C. with a heater 12. The power of the heater was controlled based on the temperature in the vicinity of a bottom surface of the crucible 11.

The organic electroluminescence materials 1a, 1b were degassed while the temperature in the vicinity of the bottom surface of the crucible 11 was kept at 200° C. for 30 minutes. After that, the crucible 11 was heated to a temperature at which the deposition rate of the organic electroluminescence material 1a reached 1.0 nm/sec, and that of the electroluminescence material 1b reached 0.1 nm/sec with respect to film thickness sensors 24a, 24b. When the respective deposition rates became stable, two substrates were put into the chamber 50 from another chamber (not shown), and film deposition was conducted. The film deposition was conducted so that the film thickness became 100 nm at center portions of the substrates 31a, 31b, and the substrates 31a, 31b were taken out immediately after the film deposition. Then, next substrates were put therein. In this process, the film deposition was conducted successively under the above-mentioned condition with respect to 20 substrates.

When the film deposition was conducted by the above-mentioned method, it took about 28.5 minutes to complete the film deposition with respect to 20 substrates. Further, a film thickness distribution of about ±5.0% was obtained in a plane of all the 20 substrates. It was found that the film deposition was conducted with excellent reproducibility even when used in such a co-deposition process. It was found from those facts that the method of the present invention is excellent in terms of the enhancement of productivity, and a product of high quality can be produced within a short period of time even when co-deposition is performed.

In the present example, although two deposition sources are used, the number of deposition sources is not limited thereto. Further, in the case where a large substrate is used, plural deposition sources and plural first pipes may be provided so as to obtain a film thickness distribution.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2006-192294, filed Jul. 13, 2006, which is hereby incorporated by reference herein in its entirety.

What is claimed is:

1. A deposition apparatus comprising:
   a chamber;
   a holding unit placed in the chamber for holding a plurality of film deposition objects such that film deposition faces thereof are mutually opposed to each;
   a deposition source for storing a deposition material to be deposited on the plurality of film deposition objects; and
   a flow unit connected to the deposition source and sandwiched between the plurality of film deposition objects to guide evaporated deposition material to the plurality of mutually opposed film deposition objects;
   wherein the flow unit includes a first pipe connected to the deposition source and a plurality of second pipes connected to the first pipe and branching from the first pipe in mutually opposed directions, and
   wherein the plurality of second pipes have openings directed to the plurality of mutually opposed film deposition objects.

2. A deposition apparatus according to claim 1, wherein lengths of the plurality of second pipes from connecting portions with respect to the first pipe are the same.

3. A deposition apparatus according to claim 1, further comprising a plurality of the deposition sources and a plurality of the flow units, wherein the deposition sources each are connected to the flow units.

4. A deposition apparatus according to claim 1, further comprising a plurality of shutters for intercepting the evaporated deposition material,
   wherein the shutter is provided in a vicinity of the openings of the plurality of second pipes.

5. A deposition apparatus according to claim 1, further comprising a transfer unit for transferring the plurality of film deposition objects.

\* \* \* \* \*